US010685698B2

(12) United States Patent
Finn et al.

(10) Patent No.: US 10,685,698 B2
(45) Date of Patent: Jun. 16, 2020

(54) MONOTONIC VARIABLE DELAY LINE

(71) Applicant: Integrated Device Technology, Inc., San Jose, CA (US)

(72) Inventors: Steven Ernest Finn, Chamblee, GA (US); Mohammed Amir Khan, Duluth, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/156,341

(22) Filed: Oct. 10, 2018

(65) Prior Publication Data
US 2020/0118612 A1   Apr. 16, 2020

(51) Int. Cl.
G11C 7/00 (2006.01)
G11C 11/4076 (2006.01)
H03K 5/133 (2014.01)
H03K 5/00 (2006.01)

(52) U.S. Cl.
CPC .......... G11C 11/4076 (2013.01); H03K 5/133 (2013.01); H03K 2005/00058 (2013.01); H03K 2005/00286 (2013.01)

(58) Field of Classification Search
None
See application file for complete search history.

(56) References Cited

U.S. PATENT DOCUMENTS

| 2007/0030753 | A1* | 2/2007 | Kwak | G11C 7/1072 365/233.11 |
| 2009/0168549 | A1* | 7/2009 | Jeon | G11C 7/02 365/189.05 |
| 2015/0188527 | A1* | 7/2015 | Francom | H03K 5/14 327/158 |
| 2016/0277015 | A1* | 9/2016 | Ma | H03K 5/1565 |

* cited by examiner

Primary Examiner — Uyen Smet
(74) Attorney, Agent, or Firm — Christopher P. Maiorana, PC

(57) ABSTRACT

An apparatus includes a plurality of coarse delay circuits and a phase blender circuit. The coarse delay circuits may be configured to (i) receive an input clock signal, (ii) receive a plurality of control signals and (iii) generate a first phase signal and a second phase signal. The phase blender circuit may be configured to (i) receive the first phase signal and the second phase signal, (ii) receive a phase control signal, (iii) step between stages implemented by the coarse delay circuits and (iv) present an output clock signal. The phase blender circuit may mitigate a mismatch between the stages of the coarse delay circuits by interpolating an amount of coarse delay provided by the coarse delay circuits.

17 Claims, 15 Drawing Sheets

MONOTONIC VARIABLE DELAY LINE

FIELD OF THE INVENTION

The invention relates to computer memory generally and, more particularly, to a method and/or apparatus for implementing a monotonic variable delay line.

BACKGROUND

In computer memory, such as dynamic random-access memory (DRAM), delay lines are used to ensure proper timing in data paths. Each delay line generally implements a coarse delay stage and a fine delay stage. Generally, mismatches between the coarse delay stages are a major source of non-monotonic behavior in timing signals.

Traditional computer memory delay lines use capacitive load switching to produce a fine delay that is independent of the coarse delay. The coarse delay is uncorrelated to the fine delay. A result of using the traditional delay line is non-monotonicity.

It would be desirable to implement a monotonic variable delay line.

SUMMARY

The invention concerns an apparatus including a plurality of coarse delay circuits and a phase blender circuit. The coarse delay circuits may be configured to (i) receive an input clock signal, (ii) receive a plurality of control signals and (iii) generate a first phase signal and a second phase signal. The phase blender circuit may be configured to (i) receive the first phase signal and the second phase signal, (ii) receive a phase control signal, (iii) step between stages implemented by the coarse delay circuits and (iv) present an output clock signal. The phase blender circuit may mitigate a mismatch between the stages of the coarse delay circuits by interpolating an amount of coarse delay provided by the coarse delay circuits.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a monotonic variable delay line that may (i) provide a consistent variable delay among instantiations, (ii) be programmable, (iii) correlate a fine delay to a coarse delay and/or (iv) be implemented as one or more integrated circuits.

Figure 1:
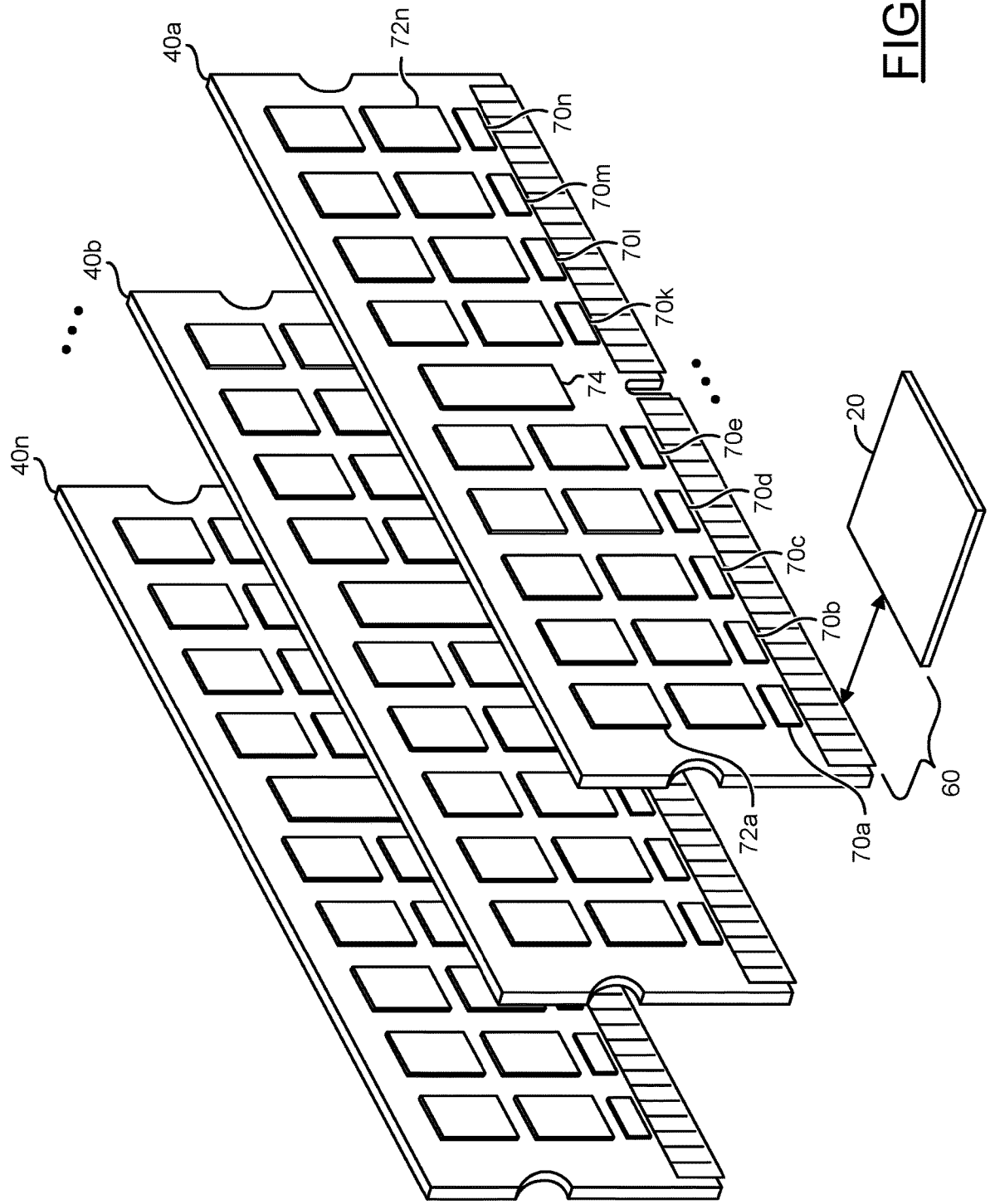
FIG. 1 is a diagram illustrating an example embodiment of a memory system in accordance with an example embodiment of the invention.

Referring to FIG. 1, a diagram of a memory system is shown in accordance with an example embodiment of the invention. In various embodiments, the memory system includes a number of circuits 40a-40n. The circuits 40a-40n may be implemented as memory modules (or boards). In an example, the circuits 40a-40n may be implemented as dual in-line memory modules (DIMMs). In some embodiments, the circuits 40a-40n may be implemented as double data rate fourth generation (DDR4) synchronous dynamic random-access memory (SDRAM) modules.

In various embodiments, the circuits 40a-40n may comprise a number of blocks (or circuits) 70a-70n, a number of blocks (or circuits) 72a-72n, a block (or circuit) 74, and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. The type, arrangement and/or number of components of the memory modules 40a-40n may be varied to meet the design criteria of a particular implementation.

The memory modules 40a-40n are shown connected to a block (or circuit) 20. The circuit 20 may implement a memory controller and/or host controller. The circuit 20 may be located in another device, such as a computing engine. Various connectors/pins/traces 60 may be implemented to connect the memory modules 40a-40n to the memory controller 20. In some embodiments, the connectors/pins/traces 60 may be a 288-pin configuration. In an example, the memory controller 20 may be a component of a computer motherboard (or main board or host device). In another example, the memory controller 20 may be a component of a microprocessor. In yet another example, the memory controller 20 may be a component of a central processing unit (CPU).

In an example, some of the connectors/pins/traces 60 may be part of the memory modules 40a-40n and some of the connectors/pins/traces 60 may be part of the motherboard and/or memory controller 20. The memory modules 40a-40n may be connected to the computer motherboard (e.g., by pins, traces and/or connectors 60) to transfer data between components of a computing device and the memory modules 40a-40n. In some embodiments, the connectors/pins/traces 60 may implement an 80-bit bus. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 40a-40n may be implemented as DDR4 SDRAM memory modules. In an example, the circuits 40a-40n may have a memory module density of 128 gigabyte (GB), one terabyte (TB), or higher per module (e.g., compared to 16 GB per dual in-line memory module (DIMM) in DDR3). In embodiments implementing DDR4 compliant SDRAM memory modules, the circuits 40a-40n may operate at voltages of 1.2-1.4 volts (V) with a frequency between 800-4266 megahertz (MHZ) (e.g., compared to 1.5-1.65V at frequencies between 400-1067 MHZ in DDR3).

In some embodiments, the circuits 40a-40n may be implemented as low voltage DDR4 memory modules and operate at 1.05V. For example, in embodiments implementing low voltage DDR4 SDRAM memory modules, the circuits 40a-40n may implement 35% power savings compared to DDR3 memory. In embodiments implementing DDR4 SDRAM memory modules, the circuits 40a-40n may support transfer data at speeds of about 2.13-4.26 giga-transfers per second (GT/s) and higher (e.g., compared to 0.8-2.13 GT/s in DDR3). The operating parameters of the memory modules 40a-40n may be varied according to the design criteria of a particular implementation.

In an example, the memory modules 40a-40n may be compliant with the DDR4 specification entitled "DDR4 SDRAM", specification JESD79-4B, June 2017, published by the Joint Electron Device Engineering Council (JEDEC) Solid State Technology Association, Arlington, Va. Appropriate sections of the DDR4 specification (e.g., the DDR4 JEDEC specification) are hereby incorporated by reference in their entirety. The JEDEC specification may refer to the DDR4 SDRAM specification, a DDR5 SDRAM specification and/or specifications for future generations of DDR SDRAM.

In some embodiments, the memory modules 40a-40n may be implemented as DDR4 load reduced DIMM (LRDIMM). The data buffers 70a-70n may allow the memory modules 40a-40n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 40a-40n may allow improved signal integrity on data signals and/or better intelligence and/or post-buffer awareness by the memory controller 20.

Figure 2:
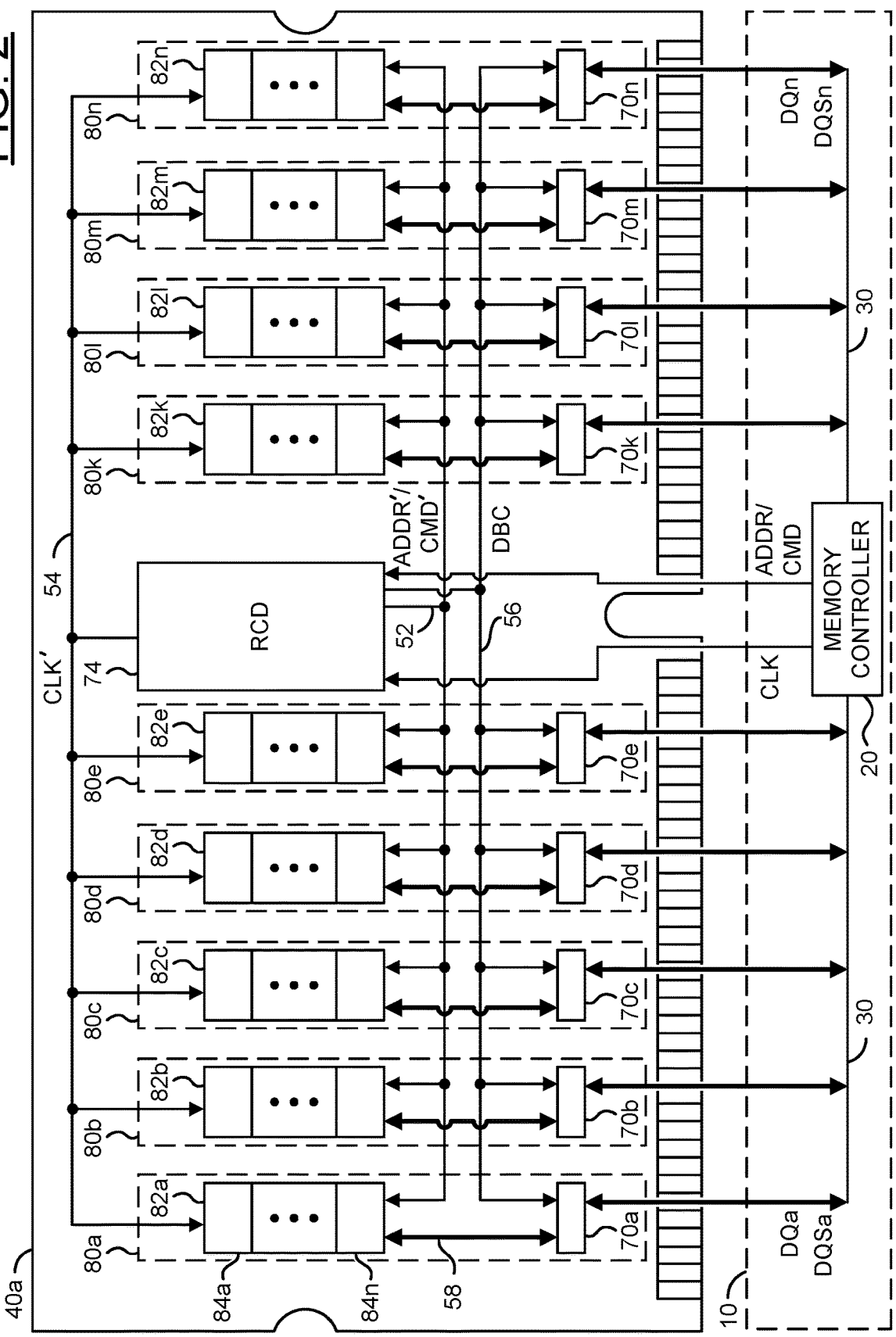
FIG. 2 is a block diagram illustrating a memory module of FIG. 1 in accordance with an example embodiment of the invention.

Referring to FIG. 2, a block diagram is shown illustrating a memory module 40a of FIG. 1. The memory module 40a may be representative of the memory modules 40b-40n. The memory module 40a is shown communicating with the memory controller 20. The memory controller 20 is shown as part of a block (or circuit) 10. The circuit 10 may be a motherboard (or main board), or other electronic component or computing engine or host device that communicates with the memory module 40a.

The memory module 40a may comprise one or more blocks (or circuits) 80a-80n and/or the RCD circuit 74. The circuits 80a-80n may implement data paths of the memory module 40a. For example, the data path 80a may include a block 82a and/or the data buffer 70a. The data paths 80b-80n may have similar implementations. In the example shown, the memory module 40a may comprise five data paths (e.g., 80a-80e) on one side of the RCD 74 and four data paths (e.g., 80k-80n) on another side of the RCD 74. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 40a-40n. A capacity of memory on the memory module 40a may be varied according to the design criteria of a particular implementation.

The memory controller 20 may generate a clock signal (e.g., CLK), a number of control signals (e.g., ADDR/CMD) and/or a number of commands. The signal CLK and/or the signals ADDR/CMD may be presented to the RCD circuit 74. A data bus 30 may be connected between the memory controller 20 and the data paths 80a-80n. The memory controller 20 may generate and/or receive data signals (e.g., DQa-DQn) and data strobe signals (e.g., DQSa-DQSn) that may be presented/received from the data bus 30. Portions of the signals DQa-DQn and DQSa-DQSn may be presented to respective data paths 80a-80n. For example, the signals DQa-DQn may be the DQ signals defined in the JEDEC specification and the signals DQSa-DQSn may be the DQS signals defined in the JEDEC specification. In the example shown, each of the signals DQa-DQn may have a corresponding signal DQSa-DQSn, however in some embodiments, one DQS signal may strobe multiple (e.g., four) DQ signals.

The RCD circuit 74 may be configured to communicate with the memory controller 20, the data buffers 70a-70n and/or the memory channels 82a-82n. The RCD circuit 74 may decode instructions (e.g., control words) received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. For example, the RCD circuit 74 may have two sets (e.g., A and B) of command/address outputs. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking.

The RCD circuit 74 may control register RCW readback. In an example, the RCD circuit 74 may implement a serial communication bus (e.g., a 1 MHZ inter-integrated circuit (I²C) bus, etc.). However, other types of management bus protocols (e.g., sideband interface, etc.) may be implemented to meet design criteria of particular implementations. In some embodiments, the RCD circuit 74 may implement a 12.5 MHZ inter-integrated circuit (I³C) bus. Inputs to the RCD circuit 74 may be pseudo-differential using external and/or internal reference voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may correspond with a signal Y_CLK in the DDR4 specification. The signal CLK' and/or the signals ADDR'/CMD' may be presented to each of the memory channels 82a-82n. In one example, the signals ADDR'/CMD' and CLK' may be transmitted on a common bus 52 and a common bus 54, respectively. In another example, the RCD circuit 74 may implement a single ADDR/CMD input and two ADDR'/CMD' outputs to support a 1:2 command/address architecture. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles for ×4 DRAMS or 8-bit bytes for ×8 DRAMs). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble, or a byte. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 500 less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 40a-40n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

Figure 3:
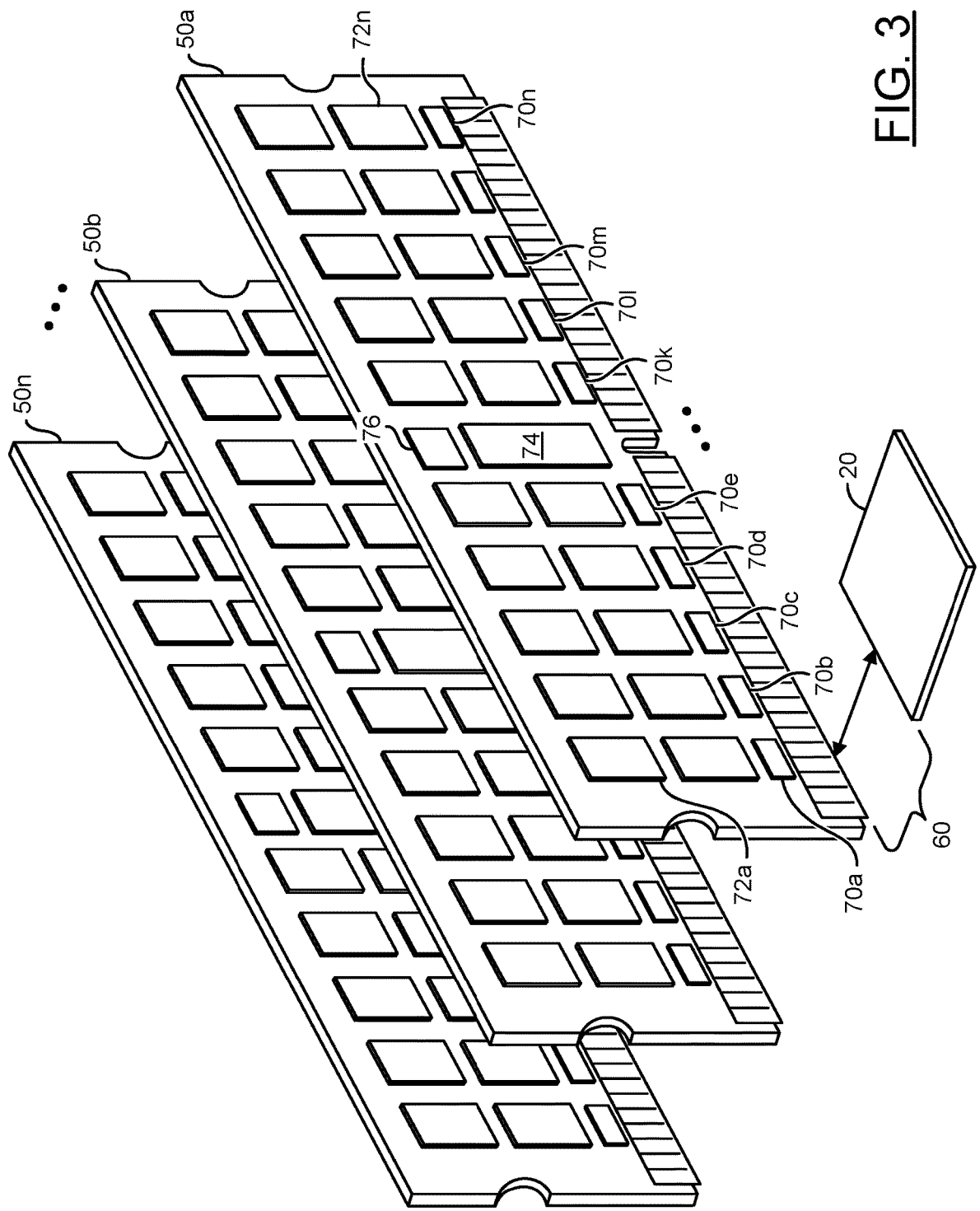
FIG. 3 is a diagram illustrating another example embodiment of a memory system in accordance with an example embodiment of the invention.

Referring to FIG. 3, a diagram of another memory system is shown in accordance with an example embodiment of the invention. In various embodiments, the memory system includes a number of circuits 50a-50n. The circuits 50a-50n may be implemented as memory modules (or boards). The circuits 50a-50n may be variations of the circuits 40a-40n. In an example, the circuits 50a-50n may be implemented as dual in-line memory modules (DIMMs). In some embodiments, the circuits 50a-50n may be implemented as double data rate fifth generation (DDR5) SDRAM modules.

In various embodiments, the circuits 50a-50n may comprise the data buffers 70a-70n, the SDRAM devices 72a-72n, the RCD circuit 74, a block (or circuit) 76 and/or various other blocks, circuits, pins, connectors and/or traces. In an example embodiment, the RCD circuit 74 may be implemented as an RCD circuit compliant with the JEDEC specification (e.g., DDR5 standard). The circuit 76 may be implemented as a power management integrated circuit (PMIC). The type, arrangement and/or number of components of the memory modules 50a-50n may be varied to meet the design criteria of a particular implementation.

The memory modules 50a-50n are shown connected to the memory controller 20. The connectors/pins/traces 60 may connect the memory modules 50a-50n to the memory controller 20. In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n.

In various embodiments, the circuits 50a-50n may be implemented as DDR5 SDRAM memory modules. In an example, the circuits 50a-50n may have a memory module density of 128 gigabyte (GB), one terabyte (TB), or higher per module (e.g., compared to 16 GB per dual in-line memory module (DIMM) in DDR3). In embodiments implementing DDR5 compliant SDRAM memory modules, the circuits 50a-50n may operate with a frequency of 1.2-3.2 giga-Hertz (GHz) and/or higher frequencies. In embodiments implementing DDR5 standard SDRAM memory modules, the circuits 50a-50n may have a data rate range from 3.2 GT/s to 4.6 GT/s. The operating parameters of the memory modules 50a-50n may be varied according to the design criteria of a particular implementation. In embodiments implementing DDR5 standard SDRAM memory modules, there may be 5 memory modules on each side of the RCD 74.

In an example, the memory modules 50a-50n may be implemented according to a fifth generation (DDR5) standard (e.g., for which a standard is currently under development by JEDEC). References to the DDR5 standard may refer to a latest working and/or draft version of the DDR5 specification published and/or distributed to committee members by JEDEC as of May 2018. Appropriate sections of the DDR5 standard are hereby incorporated by reference in their entirety. The JEDEC specification may refer to the DDR4 SDRAM specification, a DDR5 SDRAM specification and/or specifications for future generations of DDR SDRAM.

Figure 4:
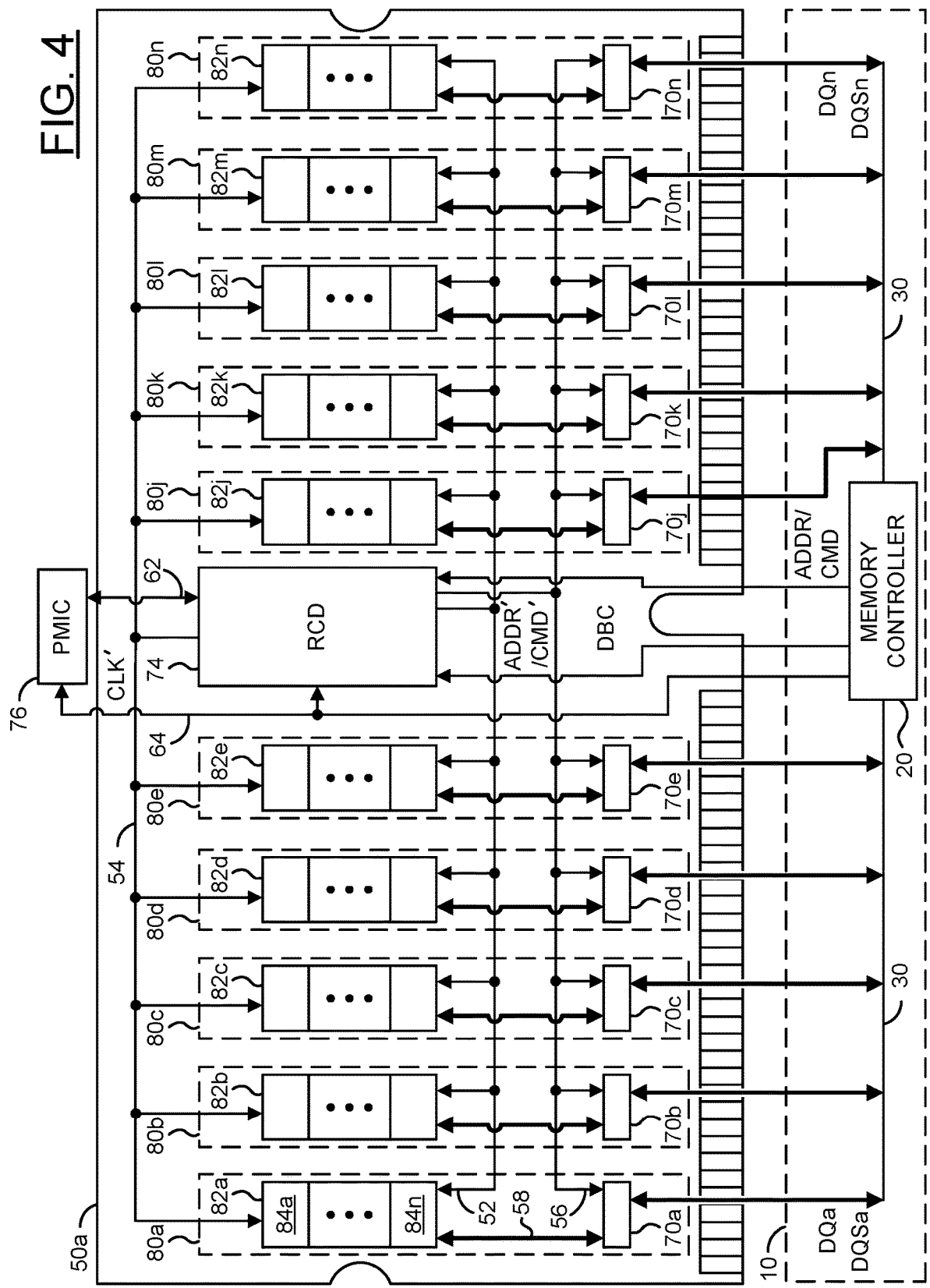
FIG. 4 is a block diagram illustrating a memory module of FIG. 3 in accordance with an example embodiment of the invention.

Referring to FIG. 4, a block diagram is shown illustrating a memory module 50a of FIG. 3. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine or host device that communicates with the memory module 50a.

The memory module 50a may comprise the data paths 80a-80n, the RCD circuit 74 and/or the PMIC 76. The data path 80a may include a block 82a and/or the data buffer 70a. The data paths 80b-80n may have similar implementations. In the example shown, the memory module 50a may comprise five data paths (e.g., 80a-80e) on one side of the RCD 74 and five data paths (e.g., 80j-80n) on another side of the RCD 74.

The memory module 50a may include the memory channels 82a-82n. Each of the memory channels 82a-82n may comprise a number of the RAM chips 84a-84n. The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate the clock signal CLK, the signals ADDR/CMD and/or a number of commands. The signal CLK and/or the signals ADDR/CMD may be presented to the RCD circuit 74. The commands may be presented to the PMIC 76 via a bus 64. The data bus 30 may be connected between the memory controller 20 and the data paths 80a-80n. The memory controller 20 may generate and/or receive the data signals DQa-DQn and the data strobe signals DQSa-DQSn that may be presented/received from the data bus 30.

The RCD circuit 74 may be configured to communicate with the memory controller 20, the data buffers 70a-70n, the memory channels 82a-82n and/or the PMIC 76. An interface 62 may be configured to enable communication between the RCD circuit 74 and the PMIC 76. For example, the interface 62 may implement a register clock driver/power management integrated circuit interface (e.g., an RCD-PMIC interface). The interface 62 may comprise one or more signals and/or connections. Some of the signals and/or connections implemented by the interface 62 may be unidirectional. Some of the signals and/or connections implemented by the interface 62 may be bidirectional. The interface 62 may be enabled by the host memory controller 20. In one example, the memory controller 20 may enable the interface 62 for the RCD using the signal ADDR/CMD. In another example, the memory controller 20 may enable the interface 62 for the PMIC 76 by presenting an enable command.

The bus 64 may be implemented as a host interface bus. The host interface bus 64 may be bi-directional. The host interface bus 64 may be configured to communicate commands and/or other data to the PMIC 76 and/or other components of the memory module 50a. In some embodiments, the bus 64 may communicate with the RCD 74. In some embodiments, the host interface bus 64 may implement an I$^2$C protocol. In some embodiments, the host interface bus 64 may implement an I$^3$C protocol. The protocol implemented by the host interface 64 may be varied according to the design criteria of a particular implementation.

Figure 5:
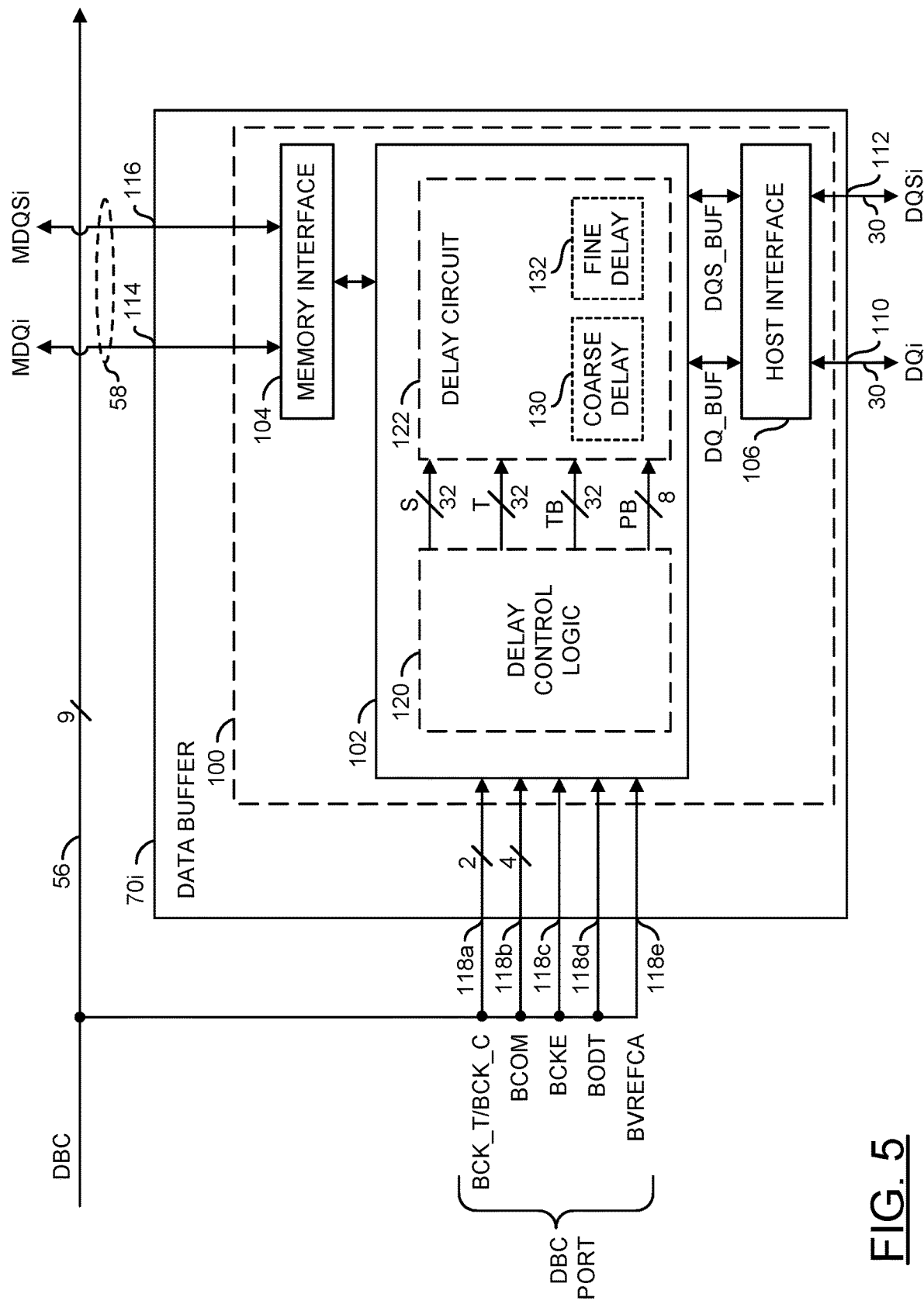
FIG. 5 is a diagram illustrating a data buffer in accordance with an example embodiment of the invention.

Referring to FIG. 5, a diagram is shown illustrating a data buffer 70i in accordance with an example embodiment of the invention. The data buffer 70i may be representative of an example embodiment of the data buffers 70a-70n. The data buffer 70i is shown having a first input/output 110, a second input/output 112, a third input/output 114 and a fourth input/output 116.

The first input/output 110 is configured for presenting/receiving the signals DQi (e.g., the data signals DQ corresponding to a memory channel) between the data buffer 70i and the controller 20. The second input/output 112 is configured for presenting/receiving the signals DQSi (e.g., the data strobe signals DQS corresponding to the memory channel) between the data buffer 70i and the controller 20. The third input/output 114 is configured for presenting/receiving the signals DQi as memory input/output signals (e.g., MDQi) corresponding to a memory channel between the data buffer 70i and the respective memory devices (e.g., DRAM chips) 72a-72n. The fourth input/output 116 is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffer 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 118a receiving the signals BCKT/BCKC, an input 118b receiving the signal BCOM, an input 118c receiving the signal BCKE, an input 118d receiving the signal BODT, and an input 118e receiving the signal BVREFCA.

In various embodiments, the signals BCK_T/BCK_C may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the duplex data buffers 70a-70n. In an example, the signal BCOM may be implemented at a single data rate (e.g., 1 bit per signal per clock cycle). However, a particular command may take a different number of clock cycles to transfer information. The signal BCKE may implement a buffered clock enable signal. In an example, the signal BCKE may be a function registered dedicated non-encoded signal (e.g., DCKE). The signal BODT may implement a buffered on-die termination signal. In an example, the signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the respective channel of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the duplex data buffer, and complete the buffer command in the buffer control word.

A function of the signal BCOM may be to transmit the buffer control words. However, compliant with the JEDEC specification for DDR4 SDRAM, the duplex RCD circuit 74 may send all read/write commands and some MRS information over the bus 56 (e.g., to allow the data buffers 70a-70n to keep track of what the memory devices 72 are doing). In some embodiments, different buffer commands may take a different number of cycles to transfer the information.

In embodiments, implementing DDR4 SDRAM, the RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

In implementations compliant with DDR5, the RCD circuit 74 may receive a mode register write (MRW) command from the memory controller 20. The RCD circuit 74 forwards MRW commands to the memory devices 72a-72n and to the data buffers 70a-70n as long as the respective output interfaces are enabled to forward commands. The MRW commands generally contain a control word (CW) bit. The CW bit generally indicates if the command is intended for the memory devices 72a-72n or for the logic devices (e.g., the RCD circuit 74 or the data buffers 70a-70n). In MRW commands targeting the logic devices, the most significant bit of an 8-bit control word address may be used, for example, to identify if the target device is the RCD circuit 74 or the data buffers 70a-70n. In general, all devices in the memory modules 50a-50n have an opportunity to snoop configuration information intended for the other devices in the same module.

The data buffers 70a-70n may be configurable. The buffer commands may allow the memory controller 20 to customize aspects of termination (e.g., ODT) and, signal strength (e.g., DRV) on the DQ and DQS lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also be utilized to send commands (e.g., data reads and/or data writes) that control data traffic through the data buffers 70a-70n. For example, some commands may optimize power consumption and noise filtering (e.g., equalization) of the data buffers 70a-70n. In another example, read/write delays may be added per data line.

The data buffers 70a-70n may implement dual multi-bit (e.g., 4-bit) bi-directional data registers with differential data strobes (e.g., DQST/DQSC). The data buffers 70a-70n may implement automatic impedance calibration. The data buffers 70a-70n may implement BCOM parity checking. The data buffers 70a-70n may implement control register (e.g., buffer control word) readback.

In some embodiments, the data buffers 70a-70n may comprise a block (or circuit or module or apparatus) 100. The circuit 100 may implement a high precision monotonic variable delay line circuit. The circuit 100, implemented in one or more of the data buffers 70a-70n, may be configured to provide a programmable and/or variable monotonic delay line. The monotonic characteristics generally means that a delay through the circuit 100 may always increase as an input signal increases in value. In particular, the delay through the circuit 100 may always increase as a delay code increase.

The circuit 100 may comprise a receiver data path for the data buffers 70a-70n. In the example shown, the circuit 100 may comprise a block (or circuit) 102, a block (or circuit) 104 and/or a block (or circuit) 106. The circuit 102 may implement one or more circuits and/or modules. In some embodiments, the circuit 102 may implement variable delay circuits, phase blender circuits and/or phase interpolator circuits. The circuit 104 may implement a memory interface. The circuit 106 may implement a host interface. The circuit 102 may generate/receive a signal (e.g., DQ_BUF) and/or a signal (e.g., DQS_BUF). In the example shown, the signal DQ_BUF may be a buffered version of the data signal DQi and the signal DQS_BUF may be a buffered version of the data strobe signal DQSi.

The circuit 102 may comprise a block (or circuit) 120 and/or a block (or circuit) 122. The circuit 122 may comprise a block (or circuit) 130 and/or a block (or circuit) 132. Details of the circuits 100, 102, 120, 122, 130 and/or 132 may be described in association with FIGS. 8-11. The circuit 100 may comprise other components and/or circuits (not shown). The number and/or type of components and/or the signals transmitted between the circuits of the apparatus 100 may be varied according to the design criteria of a particular implementation.

The circuit 120 may implement a delay control logic circuit. In one example, the circuit 120 may be configured to generate multiple configuration (or control) signals that control the delay through the circuit 122 in response to a delay code. The configuration signals may include a step configuration signal (e.g., S), differential tristate buffer configuration signals (e.g., T and TB) and a phase blender configuration signal (e.g., PB).

The circuit 122 may implement a delay circuit. In various embodiments, the circuit 122 may be configured to generate an output clock signal by delaying an input clock signal. The amount of delay may be determined by the configuration signals generated by the circuit 120.

The circuit 130 may implement a coarse delay circuit. In some embodiments, the circuit 130 may be configured to make coarse granularity step changes in the delay based on the step configuration signal and the tristate buffer configuration signal.

The circuit 132 may implement a fine delay circuit. In an example, the circuit 132 may be configured to make fine granularity steps changes in the delay based on the phase blender configuration signal.

Figure 6:
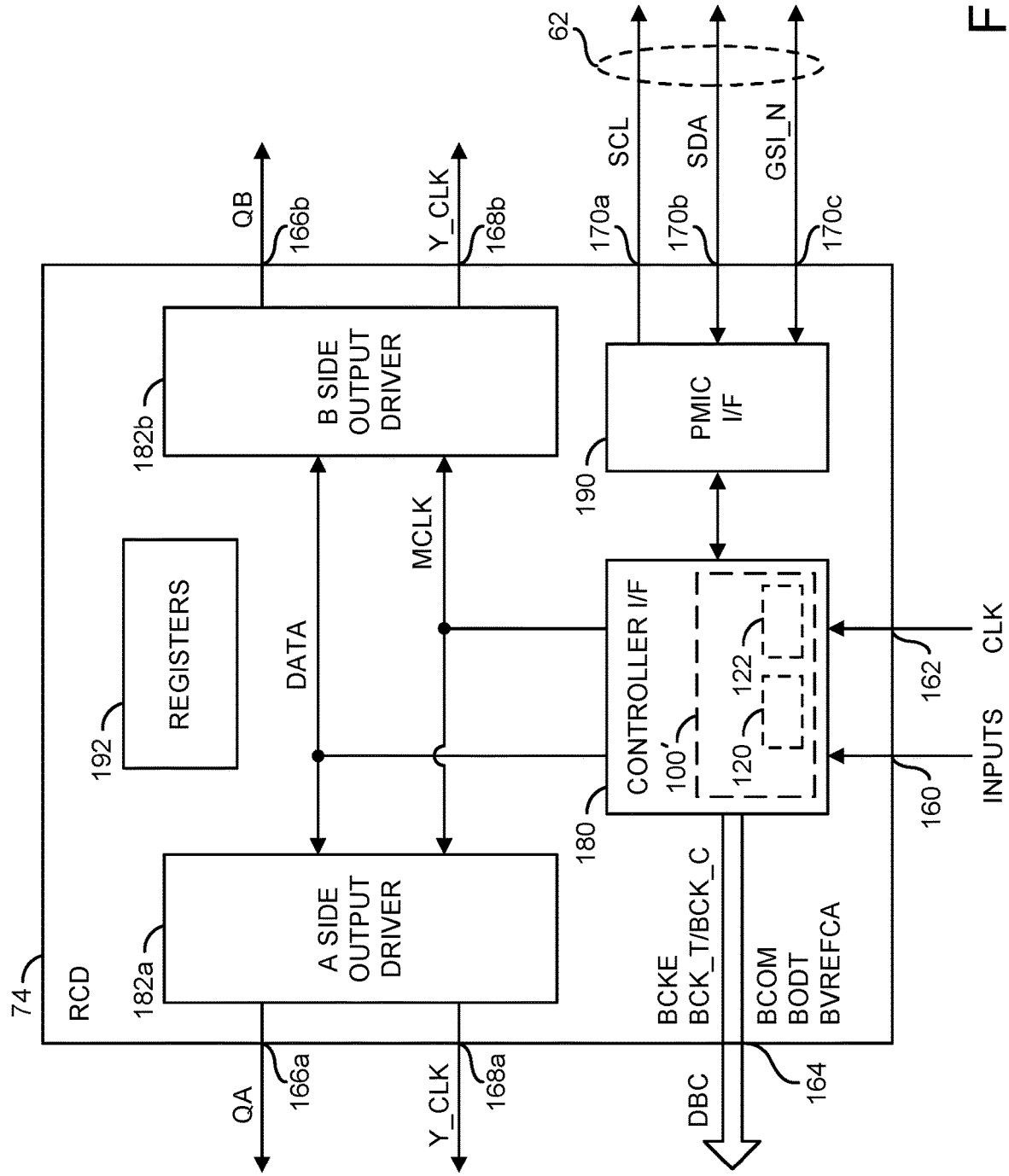
FIG. 6 is a diagram illustrating a registered clock driver in accordance with an example embodiment of the invention.

Referring to FIG. 6, a diagram is shown illustrating the registered clock driver 74 in accordance with an example embodiment of the invention. In various embodiments, the circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va. and/or compliant with the DDR5 standard).

The circuit 74 may have an input 160 that receives input data (e.g., INPUTS), an input 162 that receives the clock signal CLK, an input/output 164 that may receive/transmit control information (e.g., DBC), outputs 166a and 166b that may provide data outputs (e.g., the Q outputs QA and QB, respectively), outputs 168a and 168b that may provide output clock signals (e.g., YCLK) and/or inputs/outputs 170a-170c that may send/receive data via the interface 62. The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

The output 170a may present a signal (e.g., SCL). The input/output 170b may communicate a signal (e.g., SDA). The input/output 170c may communicate a signal (e.g., GSI_N). The signal SCL may be a clock signal. The signal SDA may be a data signal. For example, the signal SDA may communicate power data. The signal GSI_N may be an interrupt signal. The signal SDA and/or the signal GSI_N may be a bi-directional signal. The signal SCL, the signal SDA and/or the signal GSI_N may each be a portion of the information communicated using the RCD-PMIC interface 62. The number of signals, the number of connections and/or the type of data communicated using the RCD-PMIC interface 62 may be varied according to the design criteria of a particular implementation.

In various embodiments the circuit 74 may comprise a block 180, blocks (or circuits) 182a-182b, a block (or circuit) 190 and/or a block (or circuit) 192. The block 180 may implement a controller interface. The blocks 182a and 182b may implement output driver circuits. In some embodiments, the blocks 182a and 182b may be combined as a single output driver circuit 182. The block 190 may implement a PMIC interface (or port) 190 in DDR5 implementations. The block 192 may implement register space. The RCD circuit 74 may comprise other components (not shown). The number, type and/or arrangement of the components implemented by the RCD 74 may be varied according to the design criteria of a particular implementation.

The block 180 may be configured to generate a data signal (e.g., DATA) and a clock signal (e.g., MCLK). The block 180 may be configured to generate the pair of signals (e.g., BCK_T/BCK_C), a signal (e.g., BCOM), a signal (e.g., BCKE), a signal (e.g., BODT) and/or a signal (e.g., BVREFCA). The signals DATA and MCLK may be presented to the blocks 182a and 182b. In various embodiments, the signal DATA may be coupled to the blocks 182a and 182b by combinatorial logic (not shown). The blocks 182a and 182b may be configured to generate the signals QA, QB and Y_CLK.

The block 190 may be configured to generate the signal SCL. The block 190 may be configured to generate and/or receive the signal SDA and/or the signal GSI_N. The block 190 may be coupled with the controller interface 180. For example, the PMIC interface 190 and/or the controller interface 180 may be configured to facilitate communication between the PMIC 76 and the memory controller 20. The PMIC interface 190 may be enabled in response to the enable command received from the host memory controller 20. In an example, the enable command may be a VR Enable command generated by the host memory controller 20.

The block 192 may be configured to store data. For example the block 192 may comprise a number of registers used for reading from and/or writing to the RCD circuit 74. Generally, the register space 192 is coupled to the various components of the RCD using combinational logic (not shown). The block 192 may comprise a pre-defined register space to store and/or communicate power data received from and/or to be written to the PMIC 76. The pre-defined registers may store configuration data used to adjust an operating state and/or a status of the RCD 74, the interface 62 and/or the PMIC 76. In some embodiments, one or more counters may be implemented to track control words received from the host memory controller 20.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. In another example, a DDR5 standard registered clock driver (RCD) may have a number of pins defined by the DDR5 standard. However, other numbers of output pins may be implemented to meet the design criteria of a particular implementation.

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

The signal SCL may be a clock signal generated by the RCD 74. The signal SCL may be a clock signal that operates independently from the system clock signal (e.g., the signals BCK_T/BCK_C, the signal CLK and/or the signal MCLK)). In an example, the clock signal SCL may be an I²C clock output from the RCD 74 to the PMIC 76 communicated over the point-to-point interface 62. The signal SDA may be a data signal generated by the RCD 74 and/or received by the RCD 74. For example, the signal SDA may enable the host memory controller 20 to write to the PMIC 76 through the RCD 74 and/or read from the PMIC 76 through the RCD 74. In an example, the power data signal SDA may be an I²C data input/output between the RCD 74 and the PMIC 76 communicated over the point-to-point interface 62. The RCD 74 may use the interface 62 to send/receive the power data to/from the PMIC 76. The host memory controller 20 may perform a read operation and/or a write operation to the RCD 74 as defined by the DDR5 standard. For example, the host memory controller 20 may read the power data stored in the pre-defined registers. In another example, the host memory controller 20 may write instructions for the PMIC 76 into the pre-defined registers.

The RCD 74 may use the interface 62 to perform periodic polling and/or interrupt handling. The RCD 74 may use the interface 62 to communicate to the PMIC 76 that the memory module(s) 50a-50n are in a low powered state. The PMIC 76 may detect the notification from the interrupt signal GSI_N and respond accordingly.

In some embodiments, the RCD circuit 74 may comprise a block (or circuit) 100'. The circuit 100' may be a variation of the circuit 100. In some embodiments, the circuit 100' may be implemented wholly or partially within the circuit 180. The circuit 100' implemented within the RCD circuit 74 may be configured to implement the high precision monotonic variable delay line. The circuit 100' may have a similar implementation and/or functionality in the RCD 74 as in the data buffers 70a-70n (e.g., as shown in association with FIG. 5). Details of the circuit 100' may be described in association with FIGS. 8-11.

Figure 7:
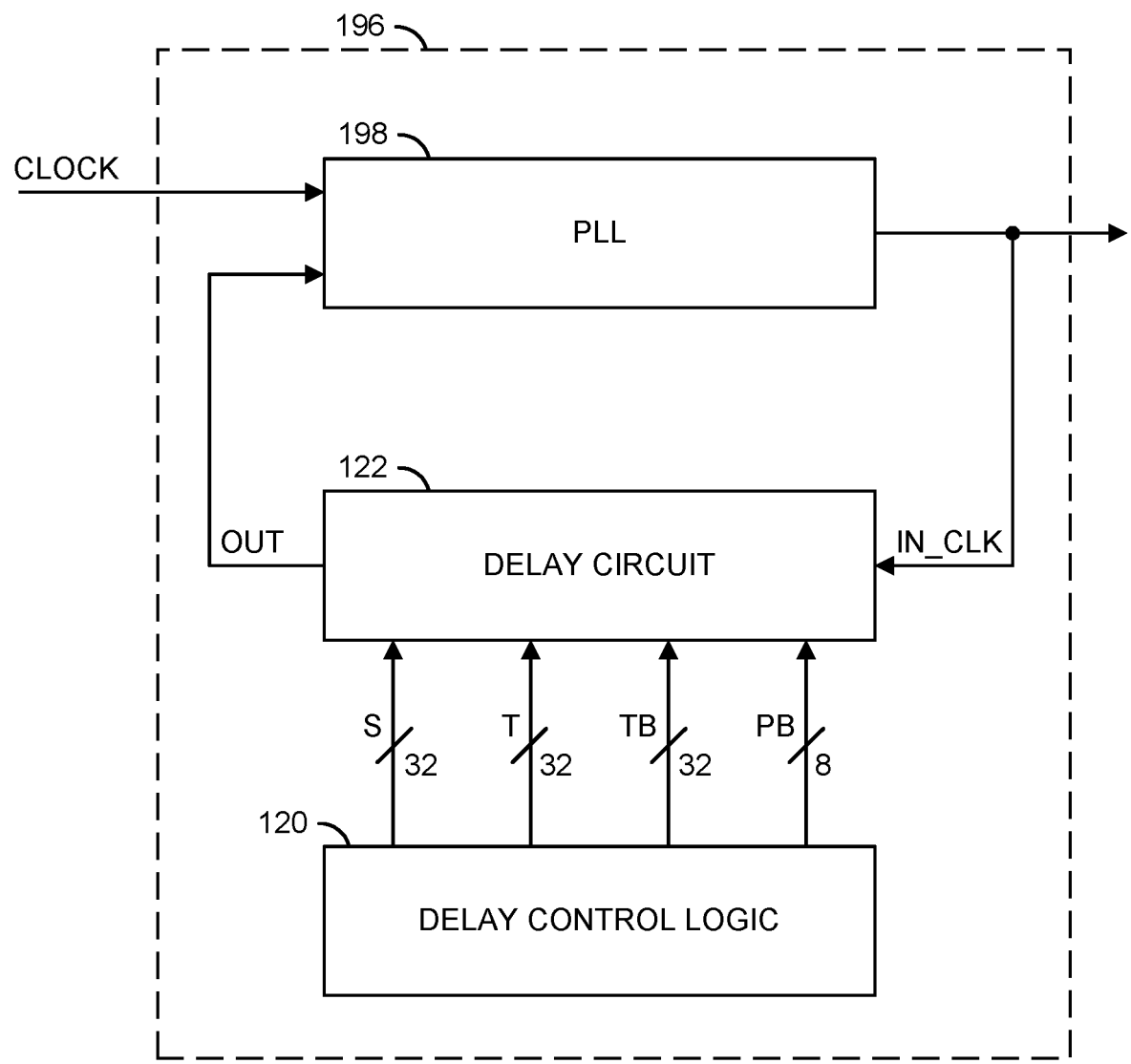
FIG. 7 is a diagram illustrating a clocking circuit in accordance with an example embodiment of the invention.

Referring to FIG. 7, a diagram illustrating an implementation of a clocking circuit 196 is shown in accordance with an example embodiment of the invention. The circuit 196 generally comprises the delay control logic circuit 120, the delay circuit 122 and/or a block (or circuit) 198. A clock signal (e.g., CLOCK) may be received by the circuit 198. An input clock signal (e.g., IN_CLK) may be generated by the circuit 198 and received by the circuit 122. A delayed output clock signal (e.g., OUT) may be generated by the circuit 122 and received by the circuit 198. Multiple delay configuration signals (e.g., S, T, TB and PB) may be generated by the circuit 120 and received by the circuit 122.

The circuit 198 may implement a phase-locked loop circuit. The circuit 198 is generally operational to generate the signal IN_CLK at the same frequency as the input signal CLOCK. A phase difference (or shift) between the signal CLOCK and the signal IN_CLK may be controlled by the signal OUT. The phase difference may be determined by the coarse delay configuration information and the fine delay configuration information presented in the signals S, T, TB and PB.

Figure 8:
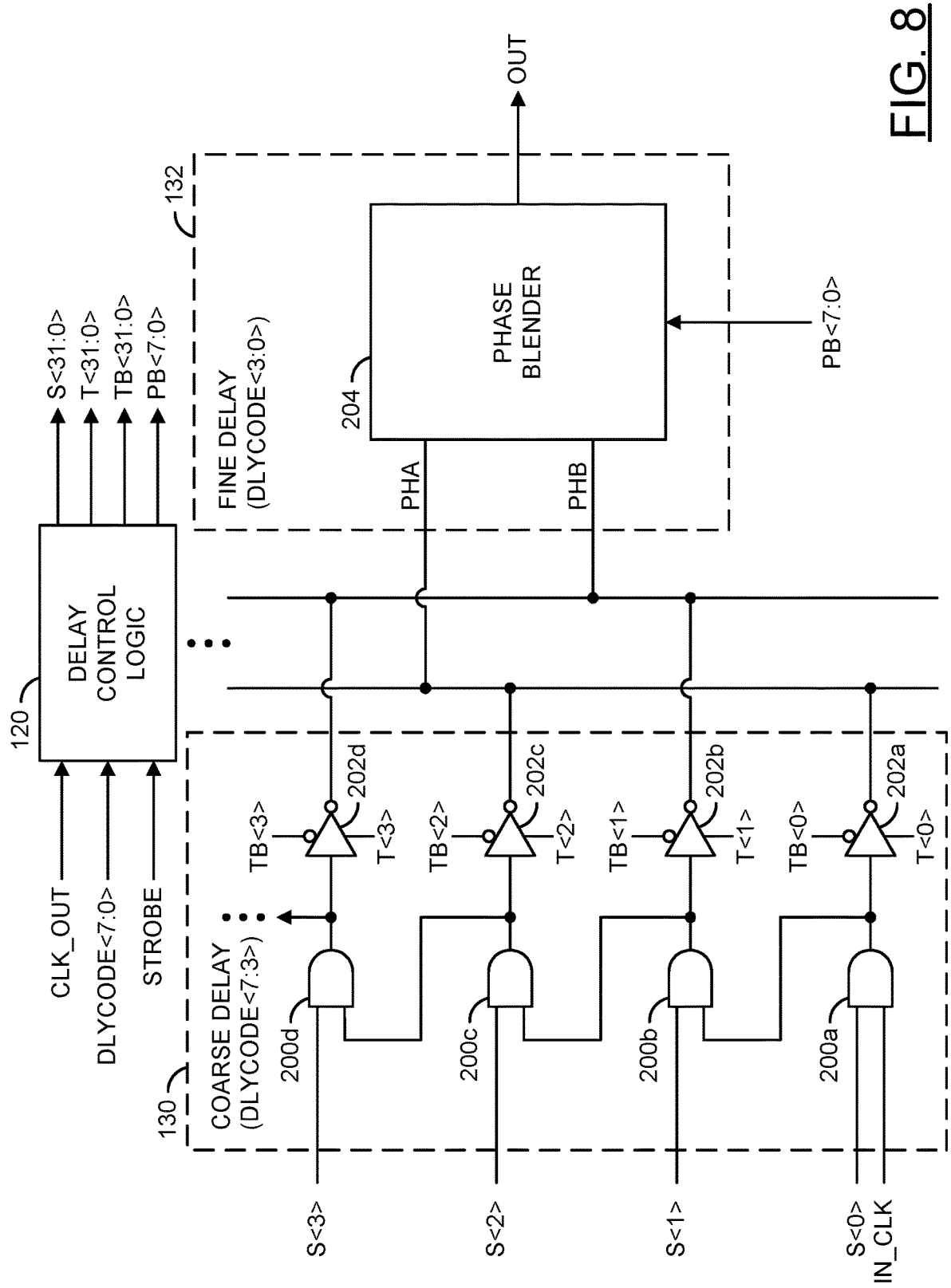
FIG. 8 is a detailed diagram of a portion of the clocking circuit in accordance with an example embodiment of the invention.

Referring to FIG. 8, a detailed diagram of an example implementation of a portion of the circuit 196 is shown in accordance with an example embodiment of the invention. The circuit 196 generally comprises the delay control logic circuit 120, the coarse delay circuit 130 and the fine delay circuit 132.

A signal (e.g., CLK_OUT) may be received by the circuit 120. The signal CLK_OUT may implement a clock signal in a given clock domain. A signal (e.g., DLYCODE) may be received by the circuit 120. The signal DLYCODE may convey a multi-bit (e.g., 8-bit) delay code that established the programmable delay through the circuit 100. A signal (e.g., STROBE) may be received by the circuit 120. The signal STROBE may implement a strobe signal used to load new delay code control signals from the signal DLYCODE.

The circuit 120 may generate the configuration signals S, T, TB and PB. The signals S, T and TB may be received by the circuit 130. The signal PB may be received by the circuit 132. The signal S may implement a coarse delay step configuration (or select) signal. The signal S may convey a multi-bit (e.g., 32-bit) coarse delay value. In various embodiments, the coarse delay value may be generated with a thermometer code. The thermometer code may have a range of binary values from all zeros (e.g., the signal OUT does not toggle) to all ones (e.g., a maximum delay). The signal T may implement a tristate inverter signal. Each bit of the signal TB may be a complement of a corresponding bit in the signal T. The differential configuration signal T/TB may convey a multi-bit (e.g., 32-bit) tristate buffer value. The tristate buffer value may be used to activate two tristate inverters at a time, one that establishes an upper boundary of the coarse delay and another that establishes a lower boundary of the coarse delay. The signal PB may convey a phase blending value. The phase blending value may control the fine delay.

The signal IN_CLK may be received by the circuit 130. The signal IN_CLK may be the clock signal generated by the phase-locked loop circuit 198. The circuit 130 may generate a signal (e.g., PHA). The signal PHA may convey a boundary for the coarse delay. A signal (e.g., PHB) may be generated by the circuit 130. The signal PHB may convey another boundary for the course delay. At some times, the signal PHA may have the upper (longer) delay boundary and the signal PHB may have the lower (shorter) delay boundary. At other times, the signal PHA may have the lower delay boundary and the signal PHB may have the upper delay boundary. The signal OUT may be generated by the circuit 132.

The circuit 130 generally comprises multiple blocks (or circuits) 200a-200n and multiple blocks (or circuits) 202a-202n. Each bit of the signal S may be received at an input node of one of the circuits 200a-200n. Each circuit 202a-202n may receive a respective bit from the signal T and a respective bit from the signal TB. Outputs of every other circuit 202a-202n may be wired together to form two busses, one for the signal PHA and another for the signal PHB.

Each circuit 200a-200n may be implemented as a logical AND gate. The circuits 200a-200n may be connected together in series. For example, an output node of the circuit 200a may be connected to an input node of the circuit 200b. An output node of the circuit 200b may be connected to an input node of the circuit 200c, and so on. While each bit of the signal S is high (e.g., a logical one) each circuit 200a-200n may generate a delayed version of the signal IN_CLK delayed by an increasing number of propagation delays through the circuits 200a-200n. For example, the delay at the output node of the circuit 200a may be one gate delay. The delay at the output node of the circuit 200b may be two gate delays, and so on. Using the thermometer code in the delay value carried by the signal S, the number of circuits 200a-200n contributing to the increasing gate delays may be adjusted.

Each circuit 202a-202n may implement a tristate inverter. Each circuit 202a-202n may be operational to pass or block the output of a respective circuit 200a-200n to the circuit 132 in response to the differential signal T/TB. While the respective bits of the differential signal T/TB are active, the tristate inverters 202a-202n may be in a pass condition. While the respective bits of the differential signal T/TB are inactive, the tristate inverters 202a-202n may present a high impedance to the circuit 132.

The circuit 204 may implement a phase blender circuit. The circuit 204 is generally operational to generate an output clock in the signal OUT by blending the input clocks received in the signals PHA and PHB based on the blending value received in the signal PB. In an example, while the blending value in the signal PB has a low value, the output clock in the signal OUT may be close in phase to the input clock in the signal PHA. While the blending value in the signal PB has a high value, the output clock in the signal OUT may be close in phase to the input clock in the signal PHB. Intermediate blending values generally result in the output clock in the signal OUT having an intermediate phase shift between the phases of the input clocks in the signal PHA and PHB.

Figure 9:
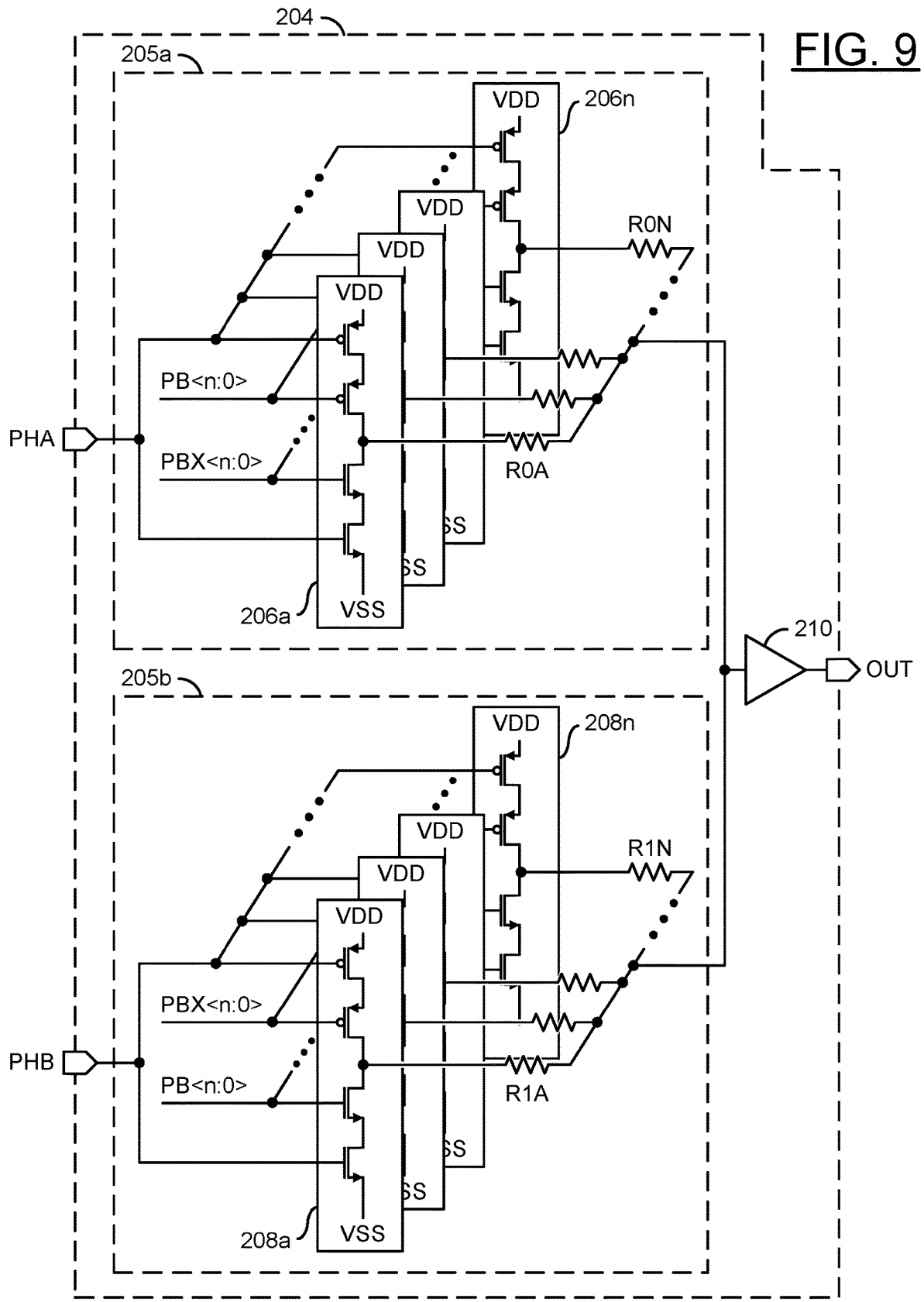
FIG. 9 is a diagram of a phase shifter circuit in accordance with an example embodiment of the invention.

Referring to FIG. 9, a diagram of an example implementation of the phase shifter circuit 204 is shown in accordance with an example embodiment of the invention. The circuit 204 generally comprises multiple blocks (or circuits) 205a-205b, and a block (or circuit) 210. The block 205a generally comprises multiple blocks (or circuits) 206a-206n and multiple resistors R0A-R0N. The block 205b generally comprises multiple blocks (or circuits) 208a-208n and multiple resistors R1A-R1N.

The signal PHA may be received by the circuit 205a. The signal PHB may be received by the circuit 205b. The signal PB and a complementary signal (e.g., PBX) may be received by both the circuit 205a and the circuit 205b. A single bit of each signal PB on a bus PB<n:0> and PBX on a bus PBX<n:0> may be received by a respective one of the circuits 206a-206n and the circuits 208a-208n. The signal OUT may be generated by the circuit 210.

Each circuit 205a-205b may implement a buffer circuit with variable current source/sink capabilities. The variable current source/sink capabilities may be established by multiple (e.g., 8) switching circuits wired in parallel. Output nodes of the circuits 205a-205b may be connected together to an input node of the circuit 210. The current source/sink capabilities may be controlled by the signals PB and PBX. While a few of the bits in the signals PB and PBX are active, the circuits 205a-205b may have a weak current source/sink capability. As more of the bits in the signals PB and PBX are made active, the source/sink capability may be increased.

Each circuit 206a-206n and 208a-208n may implement a switch circuit. The circuits 206a-206n may be wired in parallel to each other. Each output node of the circuits 206a-206n may be connected together through the respective resistors R0A-R0N to the circuit 210. The circuits 208a-2068n may be wired in parallel with each other. Each output node of the circuits 208a-208n may be connected together through the respective resistors R1A-R1N to the circuit 210. Each circuit 206a-206n and 208a-208n may be in a closed state while a corresponding signal PHA/PHB and respective bits of the signals PB/PBX are active. Each circuit 206a-206n and 208a-208n may be in an open state while a corresponding signal PHA/PHB and/or respective bits of the signals PB/PBX are inactive.

The signals PHA and PHB may control which direction the circuits 206a-206n and 208a-208n pull the input node of the circuit 210. The signals PB and PBX may control the source/sink strength by controlling the number of circuits 206a-206n and 208a-208n involved in the source/sink operation. For example, while the signal PB has a high value, all of the circuits 208a-208n may contribute to the signal at the input node of the circuit 210. Therefore, the output clock in the signal OUT may have a phase close to the input clock in the signal PHB. While the signal PB has a low value, all of the circuits 206a-206n may contribute to the signal at the input node of the circuit 210. Therefore, the output clock in the signal OUT may have a phase close to the input clock in the signal PHA.

The circuit 210 may implement a buffer circuit. The circuit 210 is generally operational to generate the signal OUT by summing the signals generated by the circuits 205a-205b.

Figure 10:
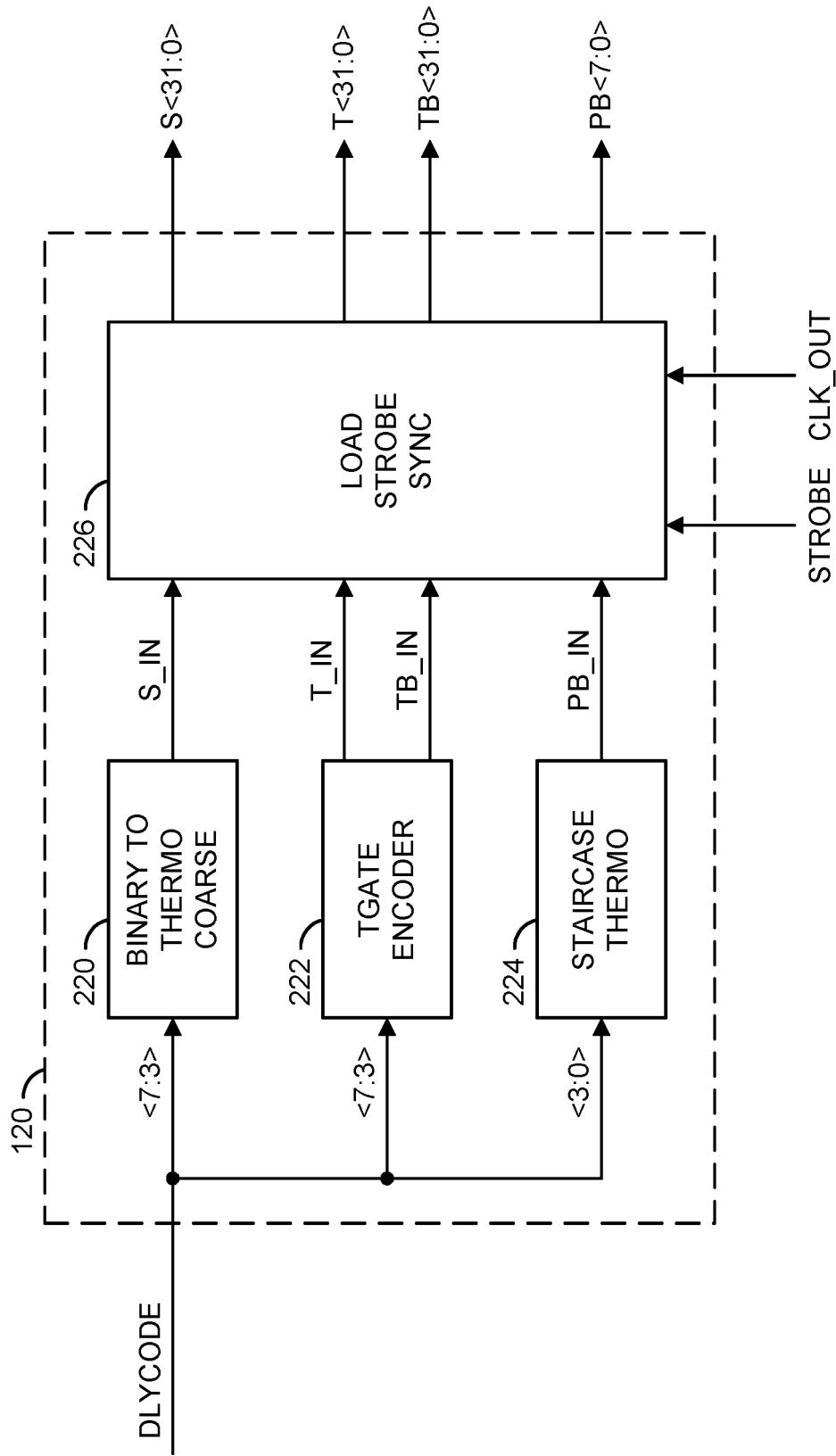
FIG. 10 is a diagram illustrating a control logic circuit in accordance with an example embodiment of the invention.

Referring to FIG. 10, a diagram illustrating an example implementation of the control logic circuit 120 is shown in accordance with an example embodiment of the invention.

The circuit 120 generally comprises a block (or circuit) 220, a block (or circuit) 222, a block (or circuit) 224 and a block (or circuit) 226.

The signal DLYCODE may be received by the circuits 220, 222 and 224. A signal (e.g., S_IN) may be generated by the circuit 220 and transferred to the circuit 226. The signal S_IN may convey a version of coarse delay value in an input clock domain. A signal (e.g., T_IN) and a signal (e.g., TB_IN) may be generated by the circuit 222 and presented to the circuit 226. The signals T_IN and TB_IN may carry the tristate buffer values in the input clock domain. The circuit 224 may generate a signal (e.g., PB_IN) received by the circuit 226. The signal PB_IN may convey the phase blender value in the input clock domain. The signal STROBE may be received by the circuit 226. A clock signal (e.g., CLK_OUT) may be received by the circuit 226. The signal CLK_OUT may be a clock in an output clock domain. The circuit 226 may generate and present the signals S, T, TB and PB.

The circuit 220 may implement a binary-to-thermometer coarse value circuit. The circuit 220 is generally operational to create the coarse delay value with a thermometer code in the signal S_IN. Higher values of the coarse delay value may result in longer delays. The coarse delay value may be received as the upper bits (e.g., <7:3>) of the delay code in the signal DLYCODE. The circuit 220 may act to enable the AND circuits 200a-200n in the course delay.

For delay code values 0 to 7: S_IN<31:2>=0; S_IN<1:0>=1

For delay code values 8 to 15: S_IN<31:3>=0; S_IN<2:0>=1

For delay code values 16 to 23: S_IN<31:4>=0; S_IN<3:0>=1

. . .

For delay code values 240 to 247: S_IN<31:0>=1

The circuit 222 may implement a tristate gate encoder circuit. The circuit 222 is generally operational to create the tristate buffer value in the signals T_IN/TB_IN. Higher values of the coarse delay value may result in longer delayed clock pairs being presented in the signals PHA and PHB. The coarse delay value may be received as the upper bits (e.g., <7:3>) of the delay code in the signal DLYCODE. The circuit 222 may act to enable the tristate inverter circuits 202a-202c that select the coarse stage outputs to be presented as the signals PHA and PHB.

For delay code values 0 to 7: T<1:0>=1, remaining bits 0

For delay code values 8 to 15: T<2:1>=1, remaining bits 0

For delay code values 16 to 23: T<3:2>=1, remaining bits 0

And so on

The circuit 224 may implement a staircase thermometer fine delay circuit. The circuit 224 is generally operational to create the phase blending value for fine delay in the signal PB_IN. Different values of the phase blending value may result in the output clock in the signal OUT having different contributions of the input clocks in the signals PHA and PHB. A phase of the output clock may match one of the input clocks, the other input clock, or somewhere in-between. The phase blending value may be received as the lower bits (e.g., <3:0>) of the delay code in the signal DLYCODE. Example phase blending values may be given by TABLE 1 as follows:

TABLE 1

| DLYCODE <3> | DLYCODE <2> | DLYCODE <1> | DLYCODE <0> | PB <7:0> |
|---|---|---|---|---|
| 0 | 0 | 0 | 0 | 00000000 |
| 0 | 0 | 0 | 1 | 00000001 |
| 0 | 0 | 1 | 0 | 00000011 |
| 0 | 0 | 1 | 1 | 00000111 |
| 0 | 1 | 0 | 0 | 00001111 |
| 0 | 1 | 0 | 1 | 00011111 |
| 0 | 1 | 1 | 0 | 00111111 |
| 0 | 1 | 1 | 1 | 01111111 |
| 1 | 0 | 0 | 0 | 11111111 |
| 1 | 0 | 0 | 1 | 01111111 |
| 1 | 0 | 1 | 0 | 00111111 |
| 1 | 0 | 1 | 1 | 00011111 |
| 1 | 1 | 0 | 0 | 00001111 |
| 1 | 1 | 0 | 1 | 00000111 |
| 1 | 1 | 1 | 0 | 00000011 |
| 1 | 1 | 1 | 1 | 00000001 |

The circuit 226 may implement a load strobe synchronization circuit. The circuit 226 is generally operational to synchronize the loading of new values in the signal S_IN, T_IN, TB_IN and PB_IN to the signals S, T, TB and PB with the clock in the signal CLK_OUT. The loading may be triggered by an assertion of the signal STROBE. When the signal STROBE is asserted, the values in the signals S_IN, T_IN, TB_IN and PB_IN may be presented in the signals S, T, TB and PB on a subsequent edge (e.g., a rising edge and/or a falling edge) of the signal CLK_OUT.

Figure 11:
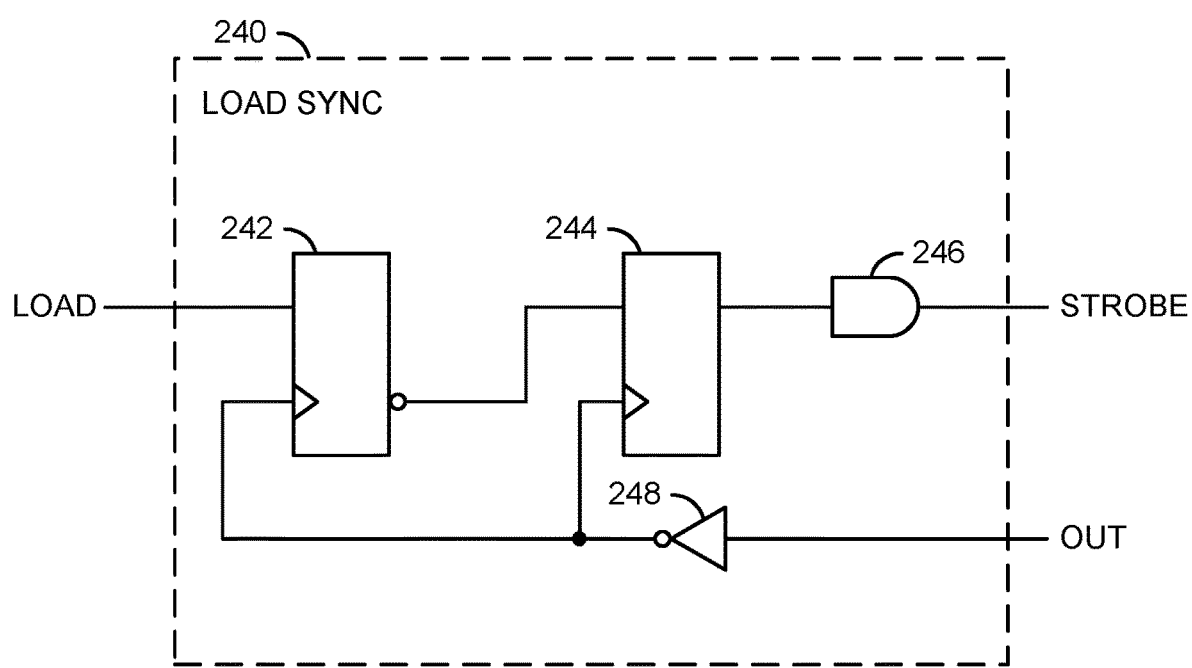
FIG. 11 is a diagram of a load synchronization circuit in accordance with an example embodiment of the invention.

Referring to FIG. 11, a diagram of an example implementation of a load synchronization circuit 240 is shown in accordance with an example embodiment of the invention. The circuit 240 is generally operational to synchronize a load signal (e.g., LOAD) across clock domains to match the clock domain of the signal OUT. The circuit 240 generally comprises a block (or circuit) 242, a block (or circuit) 244, a block (or circuit) 246 and a block (or circuit) 248.

The signal LOAD may be received by the circuit 242. The signal STROBE may be generated by the circuit 246. The signal OUT may be received by the circuit 248.

Each circuit 242 and 244 may implement a flip-flop. In various embodiments, each circuit 242 and 244 may implement a D-type flip-flop. The circuit 242 is generally operational to capture the signal LOAD on an edge of the signal OUT. The circuit 244 is generally operational to generate the signal STROBE in synchronization with a subsequent edge of the signal OUT.

The circuit 246 may implement a logical AND gate. The circuit 246 is generally operational to generate/suppress the signal STROBE. While in a pass state, the circuit 246 may pass the synchronized transition of the signal STROBE to an active state. While in a block state, the circuit 246 may present the signal STROBE in a deactivated state.

The circuit 248 may implement an inverter. The circuit 248 is generally operational to buffer and invert the signal OUT. The inverted signal OUT may be presented to clock inputs of both circuits 242 and 244.

The circuit 240 may be used to synchronize the input signal LOAD from the central processing unit with the delay-line output clock signal OUT. The circuit 240 generally produces the signal STROBE that may be used after the control combinational logic to ensure the logic has sufficient time to resolve before being applied to the delay line on falling edges of the signal OUT.

Figure 12:
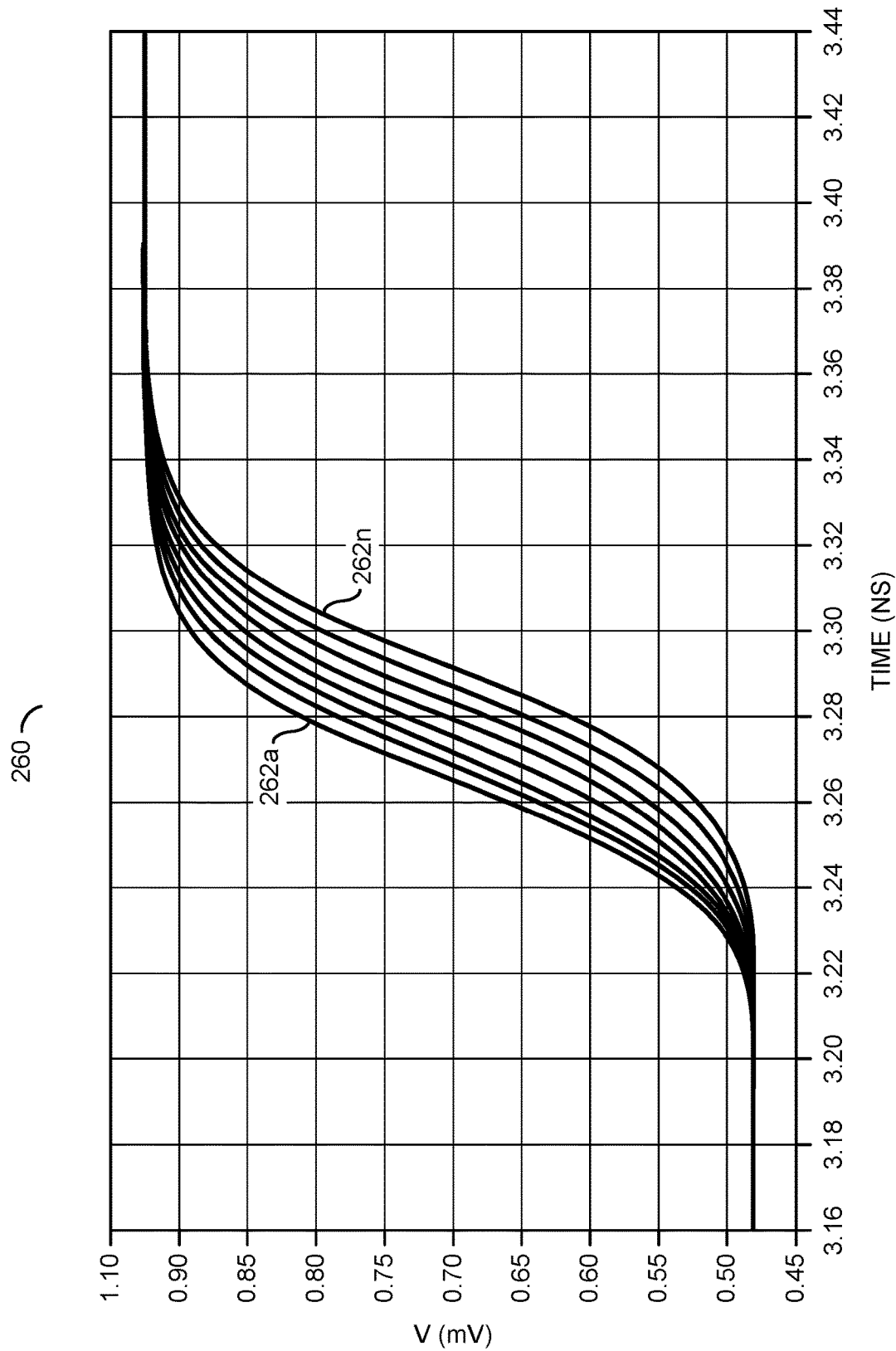
FIG. 12 is a diagram of an output signal accordance with an example embodiment of the invention.

Referring to FIG. 12, a diagram 260 of an example waveform of the signal OUT is shown in accordance with an example embodiment of the invention. The waveform may have varying delay times based on the phase blending value of the signal PB. Multiple curves 262a-262n may illustrate the rise times for different phase blending values. In various embodiments, the curve 262a may represent the signal OUT while the phase blending value has a minimum value (e.g., zero decimal). The curve 262n may represent the signal OUT while the phase blending value in the signal PB has a maximum value (e.g., 7 decimal). As shown, the phase delay in the signal OUT at 0.70 millivolts (mV) may be finely adjusted over several nanoseconds (ns) from approximately 3.265 ns to approximately 3.292 ns as the phase blending value is swept from the minimum value to the maximum value.

Figure 13:
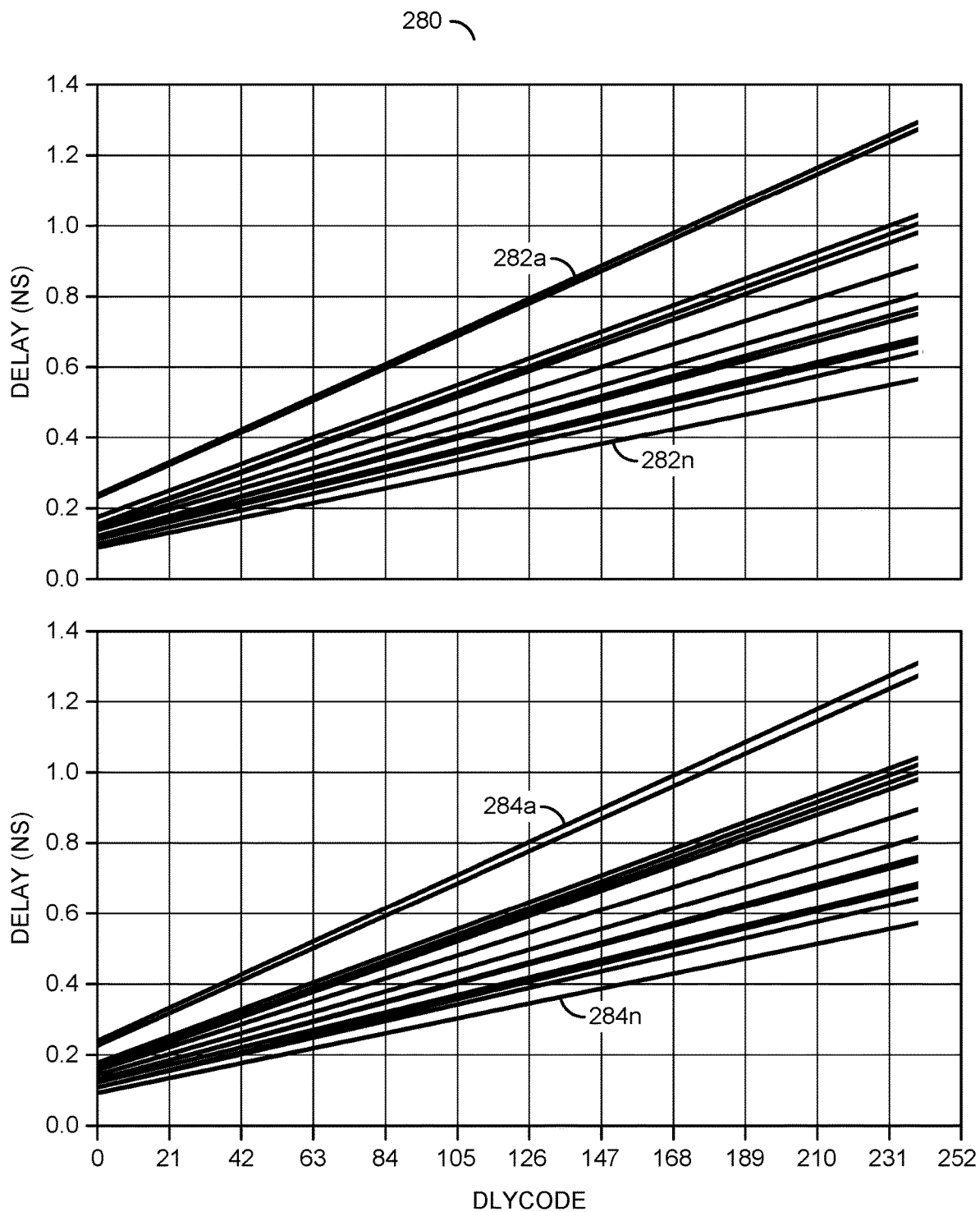
FIG. 13 is a diagram of monotonic behavior of the clocking circuit in accordance with an example embodiment of the invention.

Referring to FIG. 13, a diagram 280 of monotonic behavior of the circuit 196 is shown in accordance with an example embodiment of the invention. The delays (in nanosecond) are generally illustrated as a function of the delay values in the signal DLYCODE. The delay code may be swept from a zero value to a 248 value for all corners and plotted rising delays and falling delays with respect to the input clock. The curves 282a-282n may illustrate a basically linear monotonic behavior in the falling delays of the clock signal. The curves 284a-284n may illustrate a basically linear monotonic behavior in the rising delays of the clock signal. As may be seen in the graph 280, no glitches may exist in the curves 282a-282n and 284a-284n.

Figure 14:
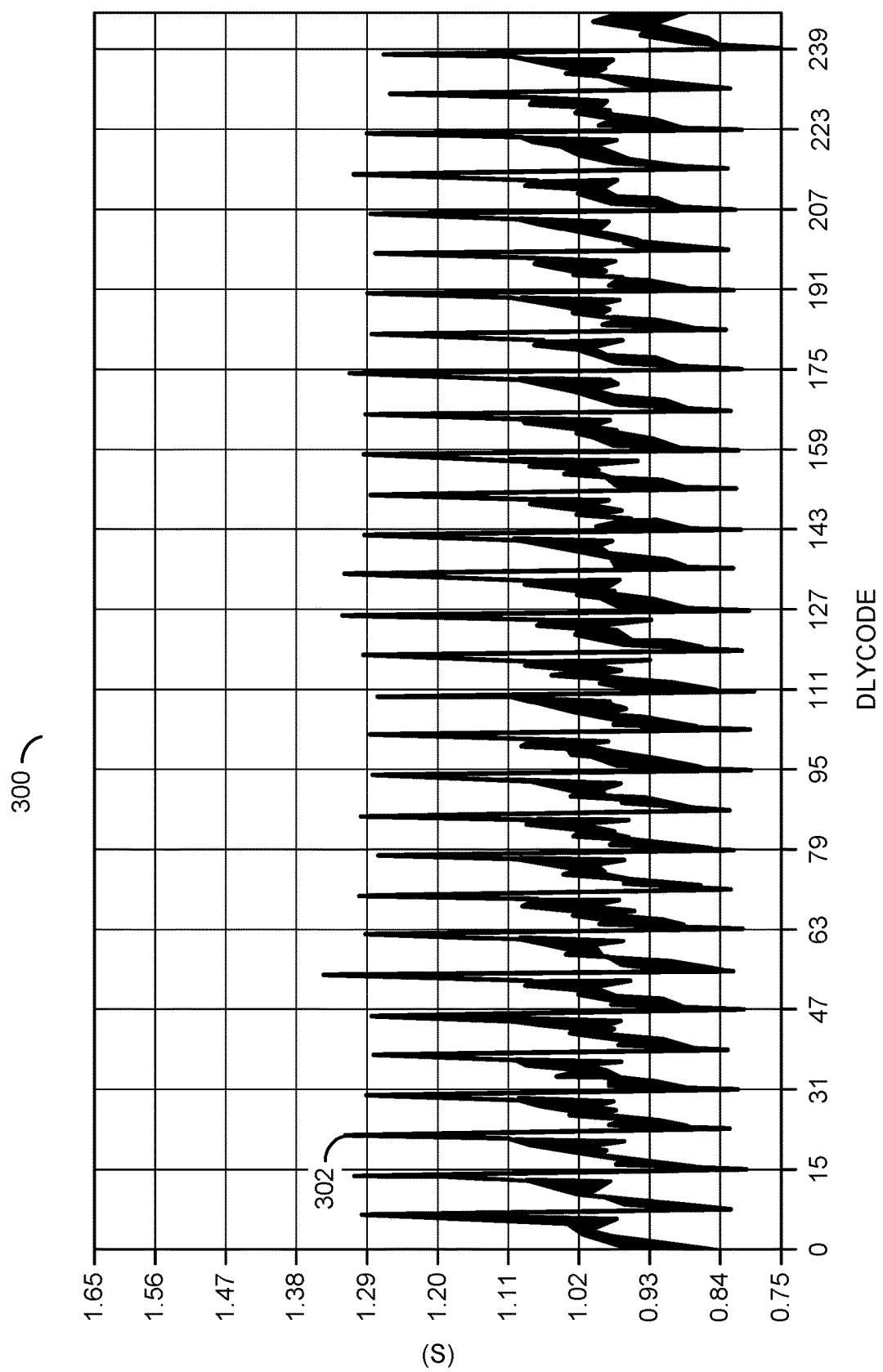
FIG. 14 is a diagram of differential non-linearity performance of the clocking circuit in accordance with an example embodiment of the invention.

Referring to FIG. 14, a diagram 300 of an example differential non-linearity performance of the circuit 196 is shown in accordance with an example embodiment of the invention. The delay variation for each delay code with respect to an average delay may be calculated per formula 1 as follows:

$$DNL=[tp-tp\_prev]/avg\_dnl\_step \quad (1)$$

where tp=out_rise−in_rise; avg_dnl_step=(delay at dlycode=248−delay at dlycode=0)/number of steps; out_rise=output rise time at 50%; in_rise=input rise time at 50%; and the number of steps=248 (e.g., 8-bit delay code)

A curve 302 generally illustrates the differential non-linearity performance normalized to a step size of a least significant bit (LSB) as a function of the delay code in the signal DLYCODE. The curve 302 shows good linearity with the differential non-linearity performance varying from approximately 0.84 LSB to approximately 1.3 LSB over a wide range of delay code values (e.g., 0 to 248).

Figure 15:
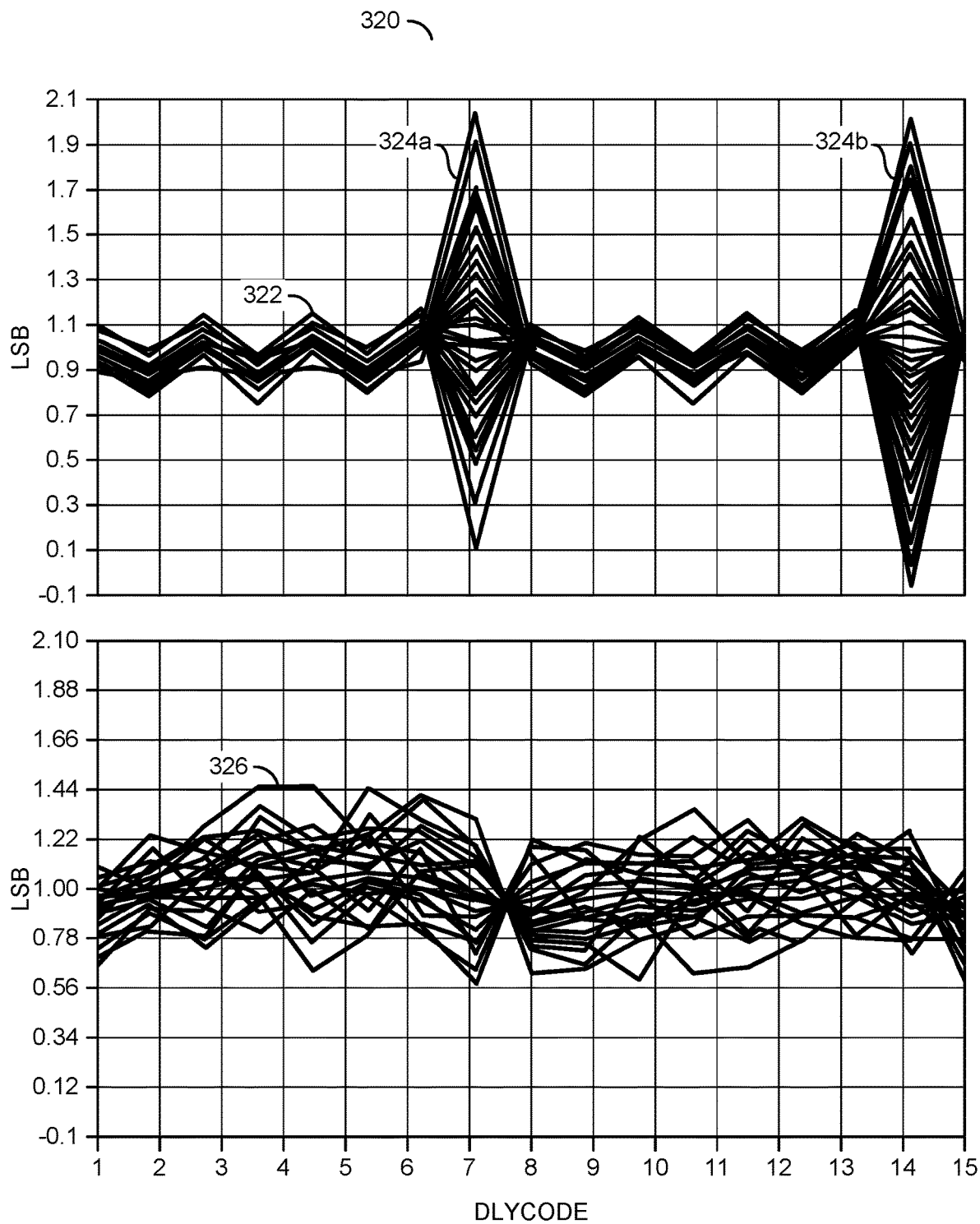
FIG. 15 is a diagram of Monte-Carlo simulated performances of a common delay line and the clocking circuit in accordance with an example embodiment of the invention.

Referring to FIG. 15, a diagram 320 of example simulated performances of a common delay line and the circuit 196 is shown in accordance with an example embodiment of the invention. The simulations may be Monte-Carlo simulations. The delay code values may be illustrated in a small range of values (e.g., 1 to 15).

A curve 322 generally illustrated the differential non-linearity performance of the common delay line. A curve 326 may illustrate the differential non-linearity performance of the circuit 100/100'. Peaks 324a and 324b in the curve 322 may illustrate delay code values where the differential non-linearity performance exceeds a least significant bit. In contrast, the curve 326 of the circuit 100/100' remains relatively stable across the delay codes, varying by less than a least significant bit.

Various embodiments of the invention may provide a programmable delay line that is monotonic. A sigma of the delay may be reduced to 0.15×LSB step size (e.g., 15 percent bounded). The sigma between same instances of the delay line may also be reduced by 25%.

Although embodiments of the invention have been described in the context of DDR4 and DDR5 applications, the present invention is not limited to DDR4 and DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 15 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a plurality of coarse delay circuits configured to (i) receive an input clock signal, (ii) receive a plurality of control signals and (iii) generate a first phase signal and a second phase signal; and
   a phase blender circuit configured to (i) receive said first phase signal and said second phase signal, (ii) receive a phase control signal, (iii) generate a delay code, and (iv), generate an output clock signal in response to said delay code by stepping between stages implemented by said coarse delay circuits, wherein (i) a delay on said output clock signal increases as a value of said delay code increases, (ii) said phase blender circuit mitigates a mismatch between said stages of said coarse delay circuits by interpolating an amount of said delay resulting from said coarse delay circuits, and (iii) said delay code comprises a plurality of differential non-linearity values bounded within 15 percent of a least significant bit of a delay step.

2. The apparatus according to claim 1, wherein said phase blender circuit further comprises a fine delay stage.

3. The apparatus according to claim 1, wherein said apparatus implements a monotonic delay line such that said output clock signal is monotonic with respect to said plurality of control signals and said phase control signal.

4. The apparatus according to claim 3, wherein said monotonic delay line provides fine granularity steps between selectable steps of said delay code.

5. The apparatus according to claim 1, further comprising a control logic configured to (i) generate (a) said plurality of control signals and (b) said phase control signal, in response to said delay code.

6. The apparatus according to claim 5, wherein said delay code comprises an 8-bit signal.

7. The apparatus according to claim 5, wherein (i) said control signals comprise a 32-bit step signal and a 32-bit differential inverter signal and (ii) said phase control signal comprises an 8-bit signal.

8. The apparatus according to claim 1, wherein each of said coarse delay circuits comprises a logical AND gate and a tristate inverter.

9. The apparatus according to claim 8, wherein (i) a first of said coarse delay circuits receives said input clock signal and one of said control signals and (ii) each of said coarse delay circuits after said first of said coarse delay circuits receives one of said control signals and an output from said logical AND gate of a previous one of said coarse delay circuits.

10. The apparatus according to claim 8, wherein (i) a first output from a first of said tristate inverters of a first group of said coarse delay circuits provide said first phase signal and (ii) a second output from a second of said tristate inverters of a second group of said coarse delay circuits provide said second phase signal.

11. The apparatus according to claim 1, wherein said phase blender circuit comprises two blocks of eight switching circuits.

12. The apparatus according to claim 11, wherein a first of said blocks of eight switching circuits receives said first phase signal and a second of said blocks of eight switching circuits receives said second phase signal.

13. The apparatus according to claim 11, wherein switching on one of said switching circuits in each of said blocks for each fine code results in an increase of one fine delay step.

14. A method for monotonic variable delay, comprising the steps of:

receiving an input clock signal and a plurality of control signals at a plurality of coarse delay circuits;

generating a first phase signal and a second phase signal with said coarse delay circuits;

receiving said first phase signal, said second phase signal and a phase control signal at a phase blender circuit;

generating a delay code in response to said first phase signal, said second phase signal and the phase control signal; and stepping between stages implemented by said coarse delay circuits in response to said delay code to generate an output clock signal, wherein (i) a delay on said output clock signal increases as a value of said delay code increases, (ii) said phase blender circuit mitigates a mismatch between said stages of said coarse delay circuits by interpolating an amount of delay resulting from said coarse delay circuits, and (iii) said delay code comprises a plurality of differential non-linearity values bounded within 15 percent of a least significant bit of a delay step.

15. The method according to claim 14, wherein the method is implemented in a double-data rate memory module.

16. The method according to claim 14, wherein the method is implemented in a data buffer of a memory module.

17. The method according to claim 14, wherein the method is implemented in a registered clock driver of a memory module.

* * * * *